United States Patent
Callahan

(10) Patent No.: US 6,657,880 B1
(45) Date of Patent: Dec. 2, 2003

(54) SRAM BIT LINE ARCHITECTURE

(75) Inventor: John M. Callahan, San Ramon, CA (US)

(73) Assignee: Virtual Silicon Technology, Inc., Sunnyvale, CA (US)

(*) Notice: Subject to any disclaimer, the term of this patent is extended or adjusted under 35 U.S.C. 154(b) by 0 days.

(21) Appl. No.: 10/310,745

(22) Filed: Dec. 4, 2002

(51) Int. Cl.[7] ................................................ G11C 5/06
(52) U.S. Cl. ............................. 365/63; 365/51; 365/69
(58) Field of Search ............................ 365/63, 51, 190, 365/69, 71

(56) References Cited

U.S. PATENT DOCUMENTS

| | | | |
|---|---|---|---|
| 5,864,181 A | 1/1999 | Keeth | 257/776 |
| 5,864,496 A | 1/1999 | Mueller et al. | 365/69 |
| 6,043,562 A | 3/2000 | Keeth | 257/776 |
| 6,069,815 A | 5/2000 | Mueller et al. | 365/63 |
| 6,075,737 A | 6/2000 | Mullarkey et al. | 365/207 |
| 6,084,307 A | 7/2000 | Keeth | 257/776 |
| 6,222,275 B1 | 4/2001 | Keeth | 257/776 |
| 6,236,606 B1 | 5/2001 | Mullarkey et al. | 365/207 |
| 6,243,311 B1 | 6/2001 | Keeth | 365/206 |
| 6,288,421 B1 | 9/2001 | Keeth et al. | 257/296 |
| 6,392,303 B2 | 5/2002 | Keeth | 257/776 |
| 6,498,758 B1 * | 12/2002 | Pomar et al. | 365/214 |

* cited by examiner

Primary Examiner—Richard Elms
Assistant Examiner—Hien Nguyen
(74) Attorney, Agent, or Firm—Patrick T. King

(57) ABSTRACT

To alleviate the crosstalk between BL and BLN of the same column, the present invention provides vertical twisting for the bit line and the complementary bit line of a line pair connecting a column of memory bits to a sense amplifier. The BL and BLN run in the same direction, but never within same metal layer and never overlying each other. To provide vertical twisting, horizontal and vertical switching are done in the same crossover channels so that BL and BLN have the same length in order to keep the overall capacitance of each line the same. Triple standard twist regions can be used for both the horizontal and vertical twists. The capacitance between BL and BLN are substantially reduced as well as the capacitance to neighboring column BLs and BLNs. Capacitive coupling between a BL and a BLN of the same column is reduced to thereby prevent reduction of the voltage difference, or delta voltage, presented to the differential input terminals of a senseamp.

27 Claims, 4 Drawing Sheets

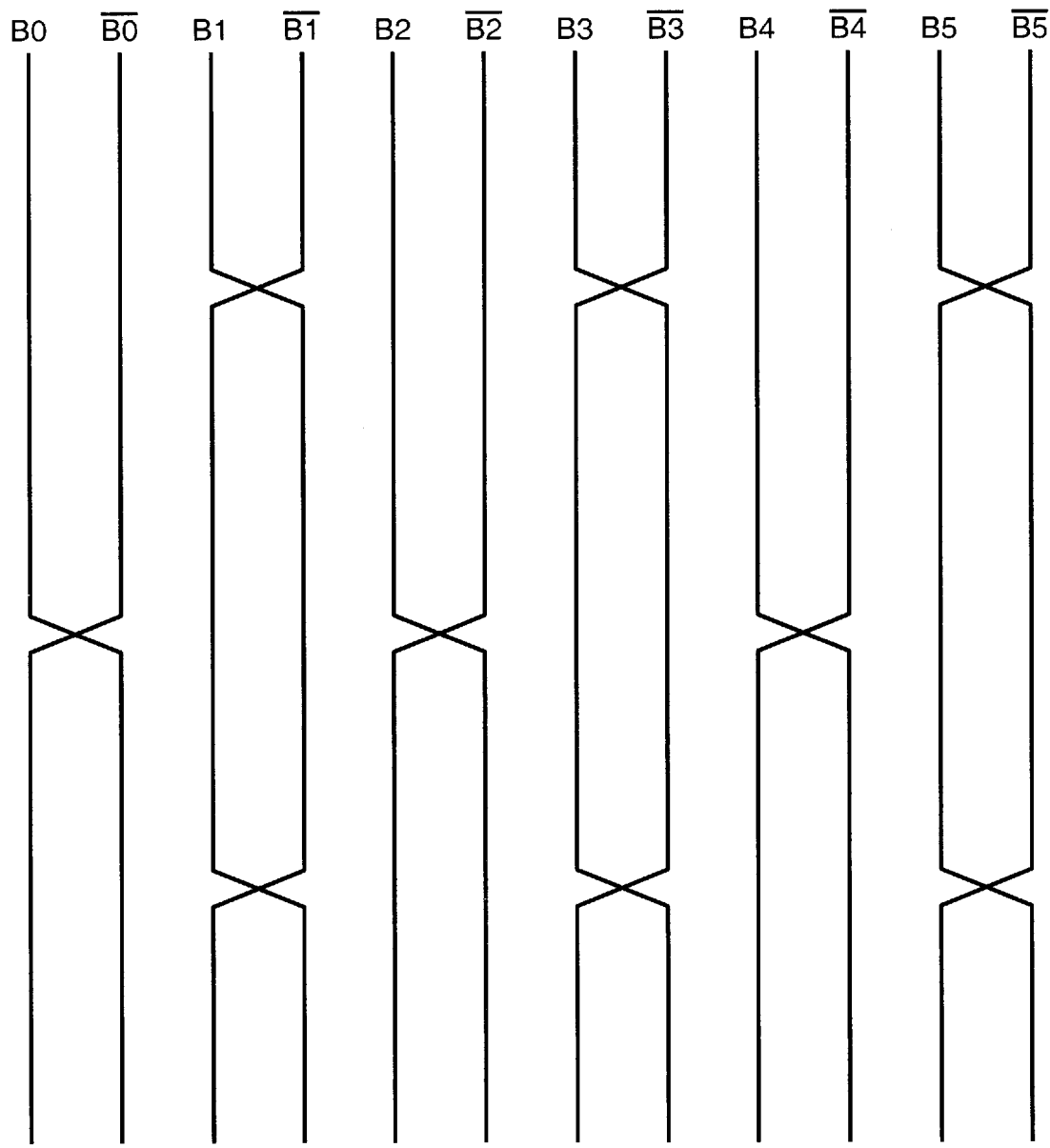
FIG._1
*(PRIOR ART)*

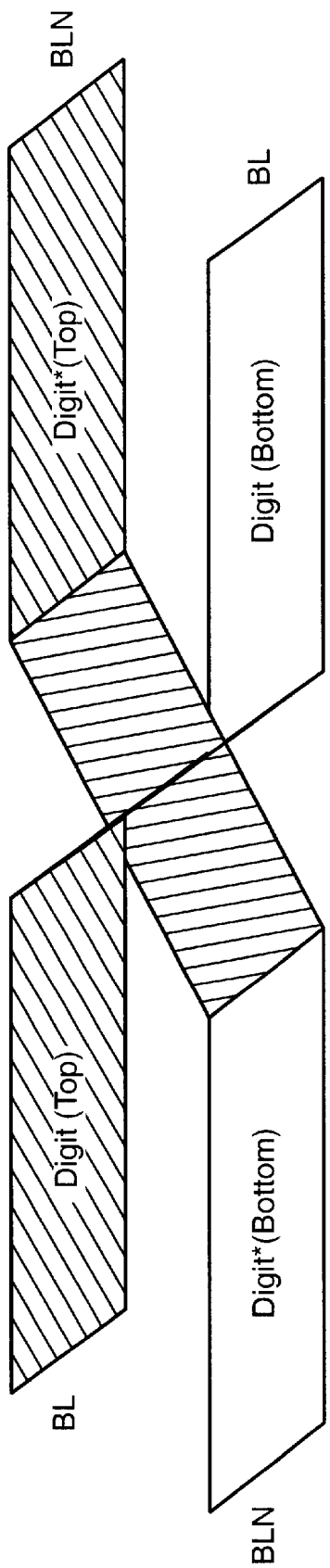
FIG._2 (PRIOR ART)

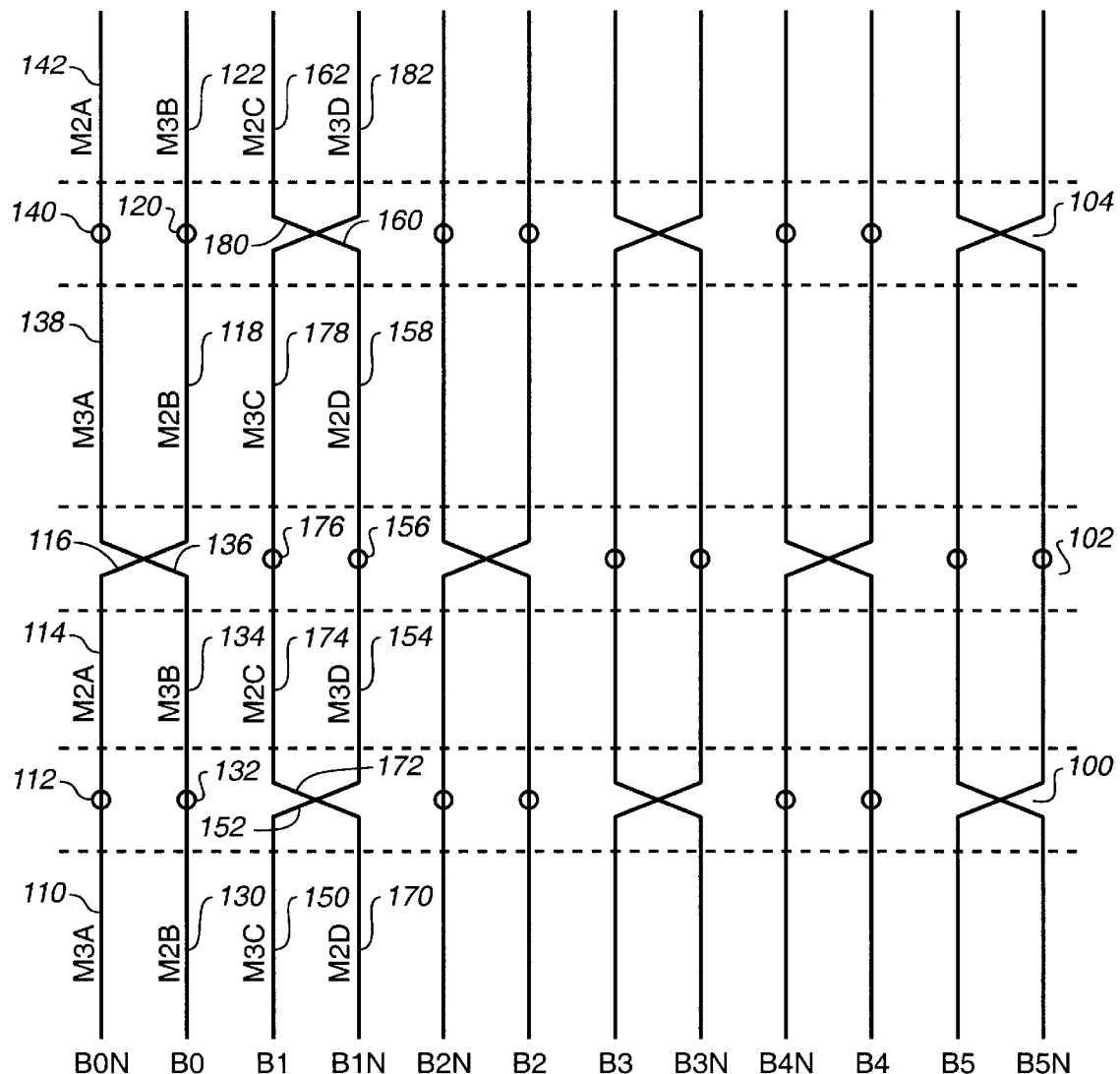
FIG._3

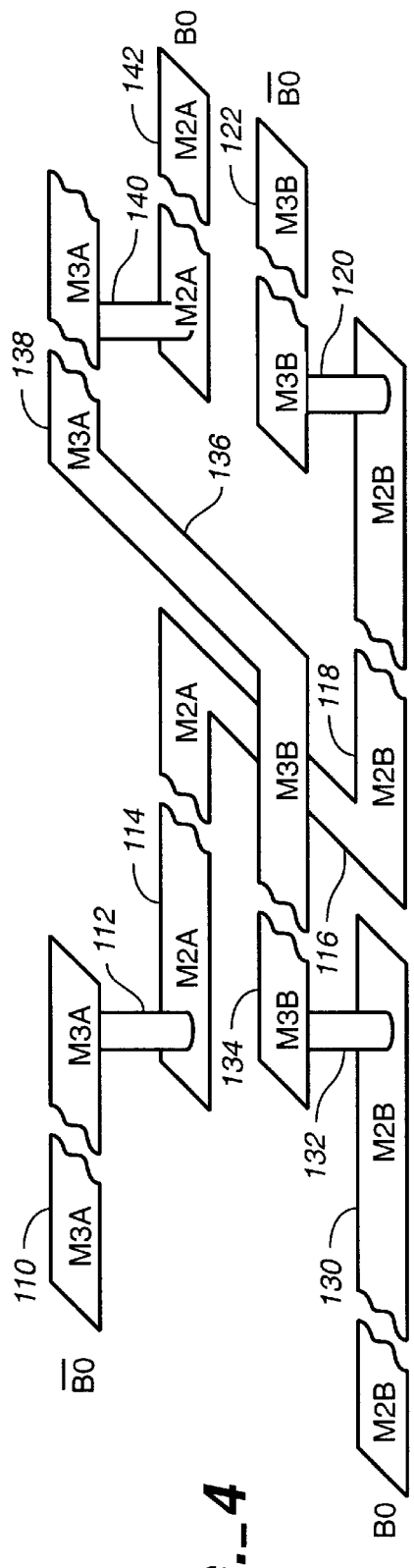
FIG._4
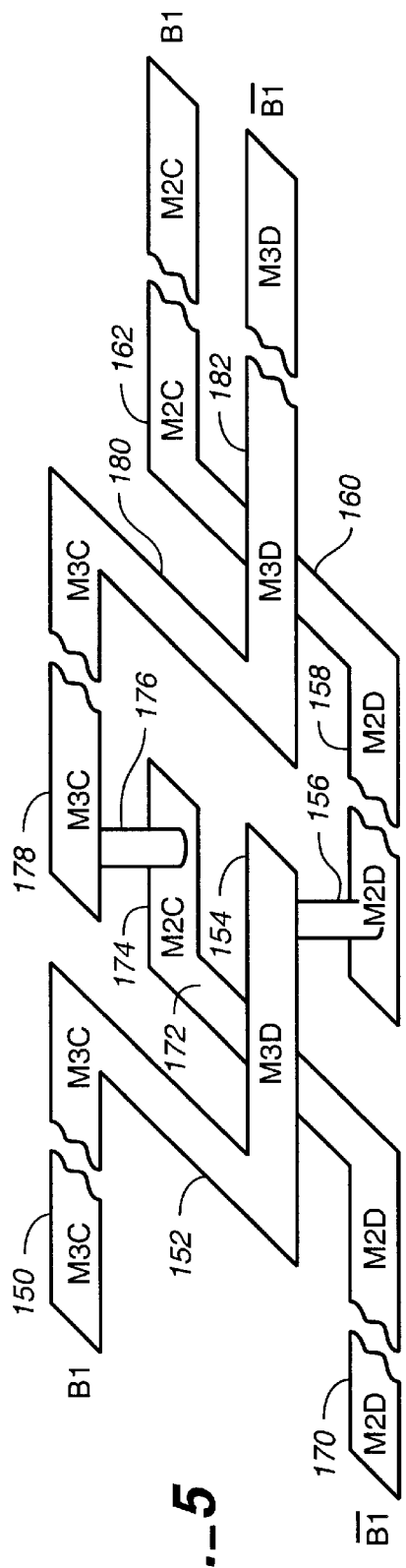
FIG._5

SRAM BIT LINE ARCHITECTURE

BACKGROUND OF THE INVENTION

1. Field of the Invention

Current static random access (SRAM) chip architecture uses a six-transistor (6T) memory cell. Connections for a bit line (BL) and a complementary bit line (BLN) to a 6T SRAM are run in either a metal 2 connection layer or a metal 3 connection layer, but not in both metal connection layers together. The 6T memory cells are arranged in columns, where each column has a common bit line and a common complementary bit lines.

2. Prior Art

If the directions in a DRAM chip are visualized as orthogonal three-dimensional x, y, and z directions, each metal connection layer can be thought of as generally being in a horizontal, or x, y plane. Each metal connection layer, such as a metal 2 layer or a metal 3 layer, is then thought of as being located in a separate horizontal plane, where the horizontal planes are vertically spaced over each other in the z direction. A vertical plane is one that runs perpendicular to a horizontal plane. The bits lines and the complementary bit lines for a column of 6T memory cells are visualized as generally running in the y direction in a horizontal plane of with a row of memory, cells running in the x direction. A straight bit line and a straight complementary bit line run parallel in the same metal layer, or horizontal plane.

In a conventional SRAM, the bit lines and the complementary bit lines for a column of memory cells are in the same horizontal metal layer and, consequently, run parallel and alongside of each other and alongside of the neighboring bit lines and complementary bit lines of their neighboring columns of memory cells.

As a consequence of this arrangement, these bit lines and complementary bit lines crosstalk to each other via the coupling capacitance between these like metal lines. Both a bit line and its corresponding complementary bit line are precharged to a ONE, or HIGH, level. A bit line or complementary bit line that is being pulled down from a precharged level is capacitively coupled to a neighboring complementary bit line or bit line and pulls it down from the precharged level. The result of this is to reduce the difference in voltage between the bit line and the complementary bit line of a particular column that is being presented to the differential input terminals of a differential sense amplifier. This reduced input voltage difference reduces the input voltage margin of the senseamp and requires a longer BL/BLN voltage differential buildup time to offset the effect of this 'talking' or parasitical capacitive coupling. This slows down the sensing process and results in more time being required to accurately read the contents of a memory cell.

FIG. 1 illustrates one previous method designed to partially alleviate capacitive coupling between lines. This method horizontally twists, or displaces, the BL and BLN lines with respect to the BL and BLN lines of a neighboring column.

Bit lines are designated as B0, B1, B2, etc., and complementary bit lines are designated as B0N, B1N, B2N, etc. Line pairs for B0/B0, B2/B2, B4/B4 each have a single standard twist, that is, one horizontal twist in their length. Alternate line pairs B1/B1, B3/B3, B5/B5 each have a triple standard twist, that is, two horizontal twists in their length.

This twisting is accomplished in the twist regions by utilizing a metal layer that is either higher or lower than the original metal level to provide appropriate connections for a horizontal twist. After the twist, both BL and BLN still run in the same metal layer. For example, if the metal lines are in metal layer 2, metal layers 1 or 3 are used to provide crossover connections for the metal lines that still remain in metal layer 2. This horizontal twist method can reduce coupling between the lines of neighboring columns, but does not affect the coupling between a particular column's own BL and BLN lines because the BL line and the BLN line are still adjacent to each other in the same metal plane.

As a result of advancements in semiconductor processing techniques, less space is available between metal lines so that the metal lines are required to be more closely spaced next to each other. In order to keep the ohmic resistance of these narrower, more closely spaced lines low, it is necessary to make these metal lines thicker in the vertical, or z, direction. This increased thickness increases the side areas of the lines and reduces the distance between these larger side areas. This produces greater coupling capacitance between these thicker, more closely spaced metal lines and results in a serious major first order effect on performance due to increased talking between these thicker lines.

Consequently, what is needed is an improved technique for routing these thicker, more closely spaced metal lines.

Certain DRAM bit line architectures, such as described in U.S. Pat. No. 6,222,275, use what is called "vertical twisting." As shown in FIG. 2, BL and BLN are directly in line horizontally, so that BL and BLN will still talk to each other via the capacitance between the conductors. The reasons given in the patent for a vertically stacked bit-line architecture for DRAM patents is to provide relief of the lower packing density of the folded bit-line architecture which also cannot utilize a cross-point layout cell structure resulting in an inefficient use of the cell matrix space. The term 'vertical twisting' as used in this patent refers to a different layout that was done for different reasons than reducing the BL and BLN crosstalk. In fact, the DRAM layout of BL and BLN enhances them talking to each other.

SUMMARY OF THE INVENTION

It is therefore an object of the invention to reduce capacitive coupling between a BL and a BLN of the same column to reduce their coupling to each other to thereby prevent reduction of the voltage difference, or delta voltage, presented to the differential input terminals of a senseamp.

In accordance with this and other objects of the invention, a memory device is provided that has a pair of digit lines (BL & BLN) formed in a first and a second vertically-spaced horizontal connection layers for a column of memory cells. Each of the digit lines has at least one vertical shift zone in which each digit line shifts between the first and the second vertically-spaced horizontal connection layers. Each of the digit lines has at least one horizontal shift zone formed in the same one of the first and second vertically spaced connection layers such that the horizontal shift zone keeping each digit line in the same connection layer. The digit lines are vertically twisted so that the digit lines do not lie next to each other in the same horizontal plane. The digit lines of the line pair are both vertically and horizontally offset with respect to each other so that one line is in one horizontal connection layer and in one vertical plane while the other line is in the other horizontal connection layer and in another vertical plane. The memory device includes an SRAM memory device.

The vertical shift zone is provided with vertical conductive connections. The vertical shift zone is located in a crossover channel that runs across a number of pairs of digit lines for various columns of SRAM cells. The horizontal shift zone is located in a crossover channel that runs across a number of pairs of digit lines for various columns of SRAM cells. The pair of digit lines are connected to two or more SRAM cells in a column of such cells.

A crossover channel is provided that runs across a number of pairs of digit lines for various columns of SRAM cells. The pairs of digit lines have alternate vertical shift zones and horizontal shift zones formed in the crossover channel.

In one embodiment of the invention the memory cells are 6T SRAM cells with six transistors. Various combinations of vertical shift zones and horizontal shift zones are used. For example, the pair of digit lines can include two vertical shift zones and one horizontal shift zone. The pair of digit lines includes one vertical shift zone and two horizontal shift zones.

The present invention also includes a method of routing a pair of digit lines formed in first and second vertically-spaced horizontal connection layers for an SRAM. The method includes the steps of: vertically shifting each of said digit lines between the first and the second vertically-spaced horizontal connection layers while remaining in the same vertical plane; and horizontally shifting each of said digit lines and keeping each digit line in the same connection layer while remaining in the same horizontal plane. The digit lines of a pair are vertically twisted so that the digit lines do not vertically lie next to each other in the same horizontal plane. The digit lines of the line pair are both vertically and horizontally offset with respect to each other so that one line is in one horizontal connection layer and in one vertical plane while the other line is in the other horizontal connection layer and in another vertical plane.

The step of vertically shifting includes connecting between the first and the second vertically-spaced horizontal connection layers with vertical conductive connections.

The step of vertically shifting each of said digit lines between the first and the second vertically-spaced horizontal connection layers while remaining in the same vertical plane includes locating a vertical shift zone in a crossover channel that runs across a number of pairs of digit lines for various columns of SRAM cells.

The step of horizontally shifting each of said digit lines and keeping each digit line in the same connection layer while remaining in the same horizontal plane includes locating a horizontal shift zone in a crossover channel that runs across a number of pairs of digit lines for various columns of SRAM cells.

The method includes the step of providing a crossover channel that runs across a number of pairs of digit lines for various columns of SRAM cells wherein the pairs of digit lines have alternate vertical shift zones and horizontal shift zones formed in said crossover channel.

BRIEF DESCRIPTION OF THE DRAWINGS

The accompanying drawings, which are incorporated in and form a part of this specification, illustrate embodiments of the invention and, together with the description, serve to explain the principles of the invention:

FIG. 1 is a line diagram showing horizontal twisting of BL and BLN.

FIG. 2 is a schematic, isometric drawing showing BL and BLN lines that cross over each other but still are vertically on top of each other.

FIG. 3 is a line diagram representing horizontal twisting combined with vertical twisting according to the invention.

FIG. 4 is an isometric drawing showing horizontal twisting combined with vertical twisting for one BL/BLN line pair of FIG. 3.

FIG. 5 is an isometric drawing showing horizontal twisting combined with vertical twisting for another BL/BLN line pair of FIG. 3.

DETAILED DESCRIPTION OF THE PREFERRED EMBODIMENT

Reference is now made in detail to one preferred embodiment of the invention, an example of which is illustrated in the accompanying drawings. While the invention is described in conjunction with the preferred embodiment, it will be understood that it is not intended to limit the invention to this embodiment. On the contrary, the invention is intended to cover alternatives, modifications and equivalents, which may be included within the spirit and scope of the invention as defined by the appended claims.

FIG. 3 in conjunction with FIGS. 4 and 5 illustrate, horizontal twisting combined with vertical twisting according to the present invention. Vertical positions in metal layers are designated as M2, indicating metal 2, as M3, indicating metal 3, and so on. Horizontal position for a metal line pair is indicated with letters. For example, the letter A, which indicates the left horizontal position in metal layer 2 or 3 and the letter B indicates the right horizontal position for the B0/B0N line pair. Thus, M3A indicates the left horizontal position in the metal 3 layer and M2B indicates the right horizontal position in the metal 2 layer. Note that the invention provides that adjacent segments of a bit line pair are in opposite metal layers and in opposite horizontal positions.

The SRAM chip is provided with crossover channels 102, 104, 100 that are formed in a chip to run across a number of pairs of digit lines for various columns of SRAM cells. Vertical shift zones between different metal layers are provided by vias that are located in a crossover channel. Crossover channels also contain horizontal shift zones either between a left horizontal position A to a right horizontal position B or between a right horizontal position B to a left horizontal position A.

As schematically illustrated in FIGS. 3 and 4, the complementary-bit B0N line starts as a line segment 110 in M3A and shifts down through a via 112 in the crossover channel 100 to a line segment 114 in M2A. A horizontal shift segment 116 in the crossover channel 102 horizontally shifts the B0N line to a line segment 118 in M2B. Finally, a via 120 in the crossover channel 104 shifts B0N up to a line segment 122 in M3B.

As also illustrated in FIGS. 3 and 4, the bit B0 line starts in a line segment 130 in M2B and shifts up through a via 132 in the crossover channel 100 to a line segment 134 in M3B. A horizontal shift segment 136 in the crossover channel 102 horizontally shifts the B0 line to a line segment 138 in M3A. Finally, a via 140 in the crossover channel 104 shift B0 down to a line segment 142 in M2A.

As illustrated in FIGS. 3 and 5, the complementary-bit B1 line starts in a line segment 150 in M3C and then shifts horizontally through a horizontal shift segment 152 in the crossover channel 100 to a line segment 154 in M3D. A via 156 in the crossover channel 102 shifts the B1 line down to a line segment 158 in M2D. A horizontal shift segment 160 in the crossover channel 104 horizontally shifts the B1 line to a line segment 162 in M2C.

As also illustrated in FIGS. 3 and 5, the bit B1N line starts in a line segment 170 in M2D and then shifts horizontally through a horizontal shift segment 172 in the crossover channel 100 to a line segment 174 in M2C. A via 176 in the crossover channel 102 shifts the B1N line up to a line segment 178 in M3C. A horizontal shift segment 180 in the crossover channel 104 horizontally shifts the B1N line to a line segment 182 in M3D.

The digit line and the complementary digit line of a line pair are vertically twisted so that the lines do not vertically overlie each other in the same vertical plane. Further, the lines are also not horizontally adjacent to each other in the same metal layer. Consequently, the digit lines of the line pair are both vertically and horizontally offset with respect to each other so that one line is in one horizontal metal connection layer and in one vertical plane while the other line is in the other horizontal metal connection layer and in another vertical plane.

To alleviate the crosstalk between BL and BLN of the same column, the present invention provides vertical twisting. This is illustrated in FIGS. 3, 4, and 5 where BL and BLN run in the same direction, but never within same metal layer or overlying each other. Horizontal and vertical switching are done in the same crossover channels so that BL and BLN have the same length in M2 and M3 in order to keep the overall capacitance of each line the same. Triple standard twist regions can be used for both the horizontal and vertical twists. It can be seen from FIG. 3 that the capacitance between BL and BLN would be substantially reduced, as well as the capacitance to neighboring column BLs and BLNs.

This scheme can be used with various other metal layers, say with using M3 and M2, or M3 and M1, etc., etc. Using M3 and M2, for instance, would result in the overall BL and BLN load capacitance being reduced, which would again result in the overall BL and BLN load capacitance being reduced, which would again result in a faster read memory bit time or access time.

While the invention has been described with the bit line and complementary bit lines being metal, they are not limited thereto. Other known conductive materials can be used for the bit lines, the complementary bit lines, the vias, and the horizontal shift line segments. The foregoing descriptions of specific embodiments of the present invention have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined by the Claims appended hereto and their equivalents.

I claim:

1. A memory device having a pair of digit lines (BL & BLN) formed in a first and a second vertically-spaced horizontal connection layers for a column of memory cells, comprising:

each of said digit lines having at least one vertical shift zone in which each digit line shifts between the first and the second vertically-spaced horizontal connection layers;

each of said digit lines having at least one horizontal shift zone formed in the same one of the first and second vertically spaced connection layers, said horizontal shift zone keeping each digit line in the same connection layer; wherein the digit lines are vertically twisted so that the digit lines do not vertically overlie each other in the same vertical plane;

whereby the digit lines of the pair are both vertically and horizontally offset with respect to each other so that one line is in one horizontal connection layer and in one vertical plane while the other line is in the other horizontal connection layer and in another vertical plane.

2. The memory device of claim 1 wherein the vertical shift zone is provided with vertical conductive connections.

3. The memory device of claim 2 wherein the vertical shift zone is located in a crossover channel that runs across a number of pairs of digit lines for various columns of SRAM cells.

4. The memory device of claim 1 wherein the horizontal shift zone is located in a crossover channel that runs across a number of pairs of digit lines for various columns of SRAM cells.

5. The memory device of claim 1 wherein the pair of digit lines are connected to two or more SRAM cells in a column of such cells.

6. The memory device of claim 1 including:

a crossover channel that runs across a number of pairs of digit lines for various columns of SRAM cells; and wherein the pairs of digit lines have alternate vertical shift zones and horizontal shift zones formed in said crossover channel.

7. The memory device of claim 1 wherein the memory cells are 6T SRAM cells with six transistors.

8. The memory device of claim 1 wherein the pair of digit lines include two vertical shift zones and one horizontal shift zone.

9. The memory device of claim 1 wherein the pair of digit lines include one vertical shift zone and two horizontal shift zones.

10. An SRAM having a pair of digit lines formed in first and second vertically-spaced horizontal connection layers, comprising:

each of said digit lines having at least one vertical shift zone in which each digit line shifts between the first and the second vertically-spaced horizontal connection layers; wherein each digit line has a first position in one horizontal connection layer and wherein each digit line has a second position on the other side of the horizontal connection layer in another horizontal connection layer;

each of said digit lines having at least one horizontal shift zone formed in the same one of the first and second vertically spaced connection layers, said horizontal shift zone keeping each digit line in the same connection layer; wherein the digit lines are horizontally twisted so that the digit lines are in different ones of the first and the second vertically-spaced horizontal connection layers and wherein the digit lines are vertically twisted so that the digit lines of the pair do not overlie each other in the same vertical plane;

whereby the digit lines of a line pair are both vertically and horizontally offset so that one line of a line pair is in one horizontal plane and one vertical plane and the other line of the line pair is in another horizontal plane and another vertical plane.

11. The SRAM of claim 10 wherein the vertical shift zone is provided with vertical conductive connections.

12. The SRAM of claim 11 wherein the vertical shift zone is located in a crossover channel that runs across a number of pairs of digit lines for various columns of SRAM cells.

13. The SRAM of claim 11 wherein the horizontal shift zones is located in a crossover channel that runs across a number of pairs of digit lines for various columns of SRAM cells.

14. The SRAM of claim 11 wherein the pair of digit lines are connected to two or more SRAM cells in a column of such cells.

15. The SRAM of claim 11 including:

a crossover channel that runs across a number of pairs of digit lines for various columns of SRAM cells; and wherein the pairs of digit lines have alternate vertical shift zones and horizontal shift zones formed in said crossover channel.

16. The SRAM of claim 11 wherein the memory cells are 6T DRAM cells with six transistors.

17. The SRAM of claim 11 wherein the pair of digit lines include two vertical shift zones and one horizontal shift zone.

18. The SRAM of claim 11 wherein the pair of digit lines include one vertical shift zone and two horizontal shift zones.

19. A method of routing a pair of digit lines formed in first and second vertically-spaced horizontal connection layers for an SRAM, comprising the steps of:

vertically shifting each of said digit lines between the first and the second vertically-spaced horizontal connection layers while remaining in the same vertical plane;

horizontally shifting each of said digit lines and keeping each digit line in the same connection layer while remaining in the same horizontal plane;

wherein the digit lines of a pair are vertically twisted so that the digit lines do not vertically overlie each other in the same vertical plane;

whereby the digit lines of the line pair are both vertically and horizontally offset with respect to each other so that one line is in one horizontal connection layer and in one vertical plane while the other line is in the other horizontal connection layer and in another vertical plane.

20. The method of claim 19 wherein the step of vertically shifting includes connecting between the first and the second vertically-spaced horizontal connection layers with vertical conductive connections.

21. The method of claim 19 wherein the step of vertically shifting each of said digit lines between the first and the second vertically-spaced horizontal connection layers while remaining in the same vertical plane includes locating a vertical shift zone in a crossover channel that runs across a number of pairs of digit lines for various columns of SRAM cells.

22. The method of claim 19 wherein the step of horizontally shifting each of said digit lines and keeping each digit line in the same connection layer while remaining in the same horizontal plane includes locating a horizontal shift zone in a crossover channel that runs across a number of pairs of digit lines for various columns of SRAM cells.

23. The method of claim 19 including the step of connecting the pair of digit lines to two or more SRAM cells in a column of such cells.

24. The method of claim 19 including the step of providing a crossover channel that runs across a number of pairs of digit lines for various columns of SRAM cells wherein the pairs of digit lines have alternate vertical shift zones and horizontal shift zones formed in said crossover channel.

25. The method of claim 19 including forming 6T memory cells for the SRAM with six transistors.

26. The method of claim 19 wherein the pair of digit lines include two vertical shift zones and one horizontal shift zone.

27. The method of claim 19 wherein the pair of digit lines include one vertical shift zone and two horizontal shift zones.

* * * * *